(12) United States Patent
Trichy Rengarajan et al.

(10) Patent No.: US 9,349,794 B2
(45) Date of Patent: May 24, 2016

(54) LAYER ARRANGEMENT

(71) Applicant: Infineon Technologies AG, Neubiberg (DE)

(72) Inventors: Gopalakrishnan Trichy Rengarajan, Villach (AT); Christian Fachmann, Fuernitz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/287,222

(22) Filed: May 27, 2014

(65) Prior Publication Data

US 2014/0264764 A1  Sep. 18, 2014

Related U.S. Application Data

(62) Division of application No. 13/598,672, filed on Aug. 30, 2012, now Pat. No. 8,772,948.

(51) Int. Cl.
| | |
|---|---|
| *H01L 29/06* | (2006.01) |
| *H01L 21/285* | (2006.01) |
| *H01L 21/74* | (2006.01) |
| *H01L 21/308* | (2006.01) |
| *H01L 21/768* | (2006.01) |

(52) U.S. Cl.
CPC ...... *H01L 29/0676* (2013.01); *H01L 21/28506* (2013.01); *H01L 21/3081* (2013.01); *H01L 21/743* (2013.01); *H01L 21/76882* (2013.01)

(58) Field of Classification Search
CPC .............. H01L 31/1113; H01L 2224/48091; H01L 2924/00; H01L 2924/00014; H01L 2224/73265; H01L 29/06
USPC ........... 257/774, 114, 104, E31.013, E31.124
See application file for complete search history.

(56) References Cited

U.S. PATENT DOCUMENTS

| | | | |
|---|---|---|---|
| 2004/0142503 A1 | 7/2004 | Lee et al. | |
| 2012/0060905 A1* | 3/2012 | Fogel et al. | 136/255 |
| 2014/0015143 A1* | 1/2014 | Liu et al. | 257/774 |

FOREIGN PATENT DOCUMENTS

| | | |
|---|---|---|
| CN | 1518134 A | 8/2004 |
| CN | 101350392 A | 1/2009 |
| CN | 101488475 A | 7/2009 |
| CN | 101872730 A | 10/2010 |

\* cited by examiner

*Primary Examiner* — Chuong A Luu
*Assistant Examiner* — Rodolfo Fortich (57) ABSTRACT

A layer arrangement in accordance with various embodiments may include: a first layer having a side; one or more nanoholes in the first layer that are open towards the side of the first layer; a second layer filling at least part of the nanoholes and covering at least part of the side of the first layer, the second layer including at least one of the following materials: a metal or metal alloy, a glass material, a polymer material, a ceramic material.

12 Claims, 8 Drawing Sheets

LAYER ARRANGEMENT

RELATED APPLICATIONS

This application is a divisional of U.S. application Ser. No. 13/598,672, filed Aug. 30, 2012, which is hereby incorporated herein by reference.

TECHNICAL FIELD

Various embodiments relate generally to a method for manufacturing a layer arrangement, and to a layer arrangement.

BACKGROUND

Modern semiconductor devices such as, for example, integrated circuit (IC) devices or chips may typically have a layer arrangement including one or more insulating, semiconducting, and/or conductive layers. In many cases, formation of such layer arrangements may include depositing one layer over another layer. For example, conductive layers may be formed by depositing electrically conductive materials such as metals or metal alloys over underlying layers. In the context of layer deposition, it may be desirable to increase adhesion between the deposited layer and the underlying layer, for example between deposited metal and an underlying semiconductor layer (e.g. silicon layer).

In the context of metal deposition, conventional methods to increase adhesion between metal and a semiconductor such as silicon may include roughening and plasma cleaning of the silicon surface. However, controlling the surface roughness may be difficult and the resultant adhesion of deposited metal may be insufficient for some cases.

SUMMARY

A method for manufacturing a layer arrangement in accordance with various embodiments may include: providing a first layer having a side; forming one or more nanoholes in the first layer that are open towards the side of the first layer; depositing a second layer over the side of the first layer after forming the nanoholes.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Various aspects of the disclosure are provided for methods, and various aspects of the disclosure are provided for devices or manufactures. It will be understood that basic properties of the methods also hold for the devices or manufactures and vice versa. Therefore, for sake of brevity, duplicate description of such properties may be omitted.

The terms "at least one" or "one or more" as used herein may be understood to include any integer number greater than or equal to one.

The term "a plurality of" as used herein may be understood to include any integer number greater than or equal to two.

The terms "coupling" or "connection" as used herein may be understood to include a direct "coupling" or direct "connection" as well as an indirect "coupling" or indirect "connection", respectively.

The terms "formed over", "deposited over", "disposed over", "located over", "arranged over" as used herein are intended to include arrangements where a first element or layer may be formed, deposited, disposed, located or arranged directly on a second element or layer with no further elements or layers in-between, as well as arrangements where a first element or layer may be formed, deposited, disposed, located or arranged above a second element or layer with one or more additional elements or layers between the first element or layer and the second element or layer.

The terms "nanohole", "nanopore", and "nanocavity" as used herein may be understood to include, respectively, a hole, pore, or cavity having an extent in the nanometer range in at least one spatial direction, alternatively having an extent in the nanometer range in at least two spatial directions, alternatively having an extent in the nanometer range in all spatial directions.

The term "nanoporous layer" or "nanoporous material" as used herein may be understood to include layers or materials having one or more nanopores or nanoholes, e.g. a plurality (e.g. tens, hundreds, or thousands, or even more) of nanopores or nanoholes. One or more nanopores or nanoholes of a nanoporous layer may, for example, lead from a first side of the layer to a second (e.g. opposite) side of the layer. For example, one or more nanopores or nanoholes of a nanoporous layer may form one or more channels in the nanoporous layer, for example connecting the first side with the second side of the nanoporous layer.

Various embodiments provide methods for manufacturing a layer arrangement and layer arrangements, in which adhesion of a deposited layer (for example, a metal layer or metal alloy layer, alternatively a layer including or consisting of other materials) to an underlying layer (for example, a semiconductor layer such as a silicon layer, alternatively a layer including or consisting of other materials) may be improved by means of physical interlocking of the material of the deposited layer (e.g. metal or metal alloy) and the material of the underlying layer (e.g. silicon).

In various embodiments, nanoholes (e.g. nanocavities or nanopores), herein also referred to as nanostructures, may be formed in the underlying layer (for example, in a layer of a semiconductor substrate or carrier such as e.g. a wafer, e.g. silicon wafer), which may help in proper adhesion of the deposited material (e.g. metal or metal alloy) on the underlying layer (for example, semiconductor layer, e.g. silicon layer).

One aspect of various embodiments may be seen in that adhesion may take place by a physical mechanism (namely, interlocking of deposited material (e.g. metal) and nanostructures or nanoholes (e.g. nanocavities or nanopores) formed in an underlying layer) and no extensive chemical treatment steps may be needed.

Another aspect of various embodiments may be seen in that, apart from improved adhesion, such nanostructures or nanoholes (e.g. nanocavities or nanopores) may also reduce contact resistance significantly, and/or may serve as very efficient heat sink (for example, on the backside of a chip) due to a very large surface area at the interface.

Figure 1:
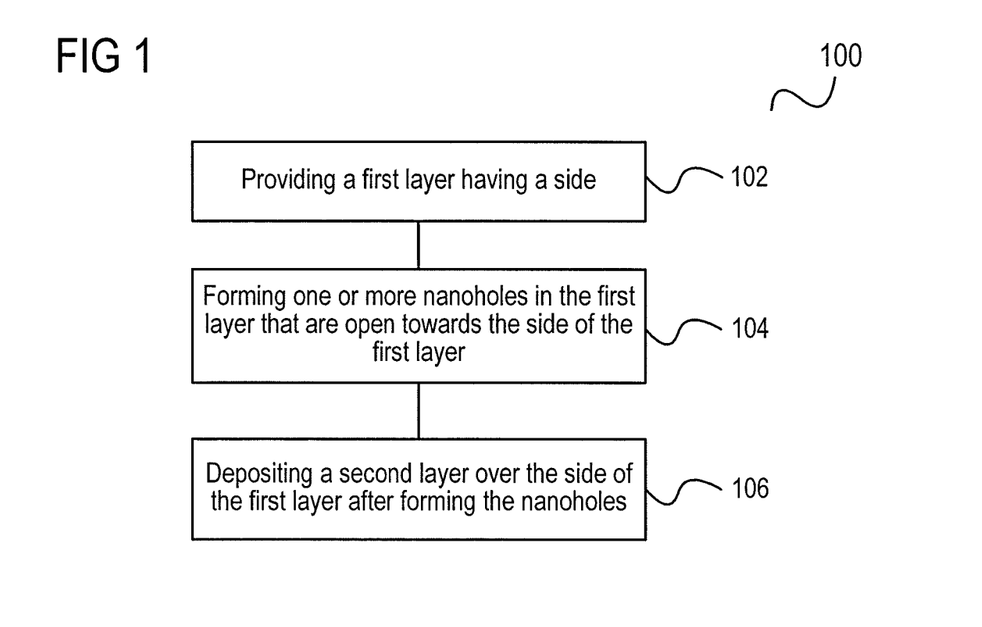
FIG. 1 shows a method for manufacturing a layer arrangement in accordance with various embodiments.

FIG. 1 shows a method 100 for manufacturing a layer arrangement in accordance with various embodiments.

As shown in 102, a first layer having a side may be provided. In one or more embodiments, the side may be a top side of the first layer.

In accordance with an embodiment, the first layer may include or may consist of a semiconductor material such as, for example, silicon. Alternatively or in addition, the first layer may include or consist of other materials, e.g. other semiconductor materials (including compound semiconductor materials, e.g. binary, ternary, quaternary, . . . , compound semiconductors) such as, for example, germanium, silicon germanium, a IV-IV compound semiconductor material, a III-V compound semiconductor material, a II-VI compound semiconductor material, or others.

In accordance with another embodiment, the first layer may be part of a semiconductor substrate such as, for example, a wafer, e.g. a silicon wafer, although other types of wafers may be possible as well in accordance with some embodiments.

In accordance with another embodiment, the side of the first layer may be or correspond to a main processing surface of the semiconductor substrate, e.g. of the wafer, e.g. silicon wafer. In one or more embodiments, the side of the first layer may be a top side of the semiconductor substrate (e.g. wafer).

In accordance with another embodiment, the side of the first layer may be or correspond to a backside of the semiconductor substrate, e.g. a backside of the wafer, e.g. a backside of the silicon wafer.

In accordance with another embodiment, the first layer may include or may be an electrical terminal region, for example an electrical terminal region of an electronic device, for example a source/drain region of a transistor.

As shown in 104, one or more (for example, a plurality or multiplicity of, e.g. tens, hundreds, or thousands, or even more in accordance with some embodiments) nanoholes (e.g. nanocavities or nanopores) may be formed in the first layer that are open towards the side of the first layer. In other words, the one or more nanoholes may have an opening at the side of the first layer.

In accordance with an embodiment, forming the nanoholes in the first layer may include or may be achieved by: forming a nanoporous mask layer over the side of the first layer; etching the first layer using the nanoporous mask layer as an etch mask; and removing the nanoporous mask layer after etching the first layer.

The nanoporous mask layer may include a plurality of nanopores or nanoholes. The nanopores or nanoholes may, for example, be arranged to form a regular array (nanohole array). The nanopores or nanoholes may, for example, form one or more (e.g. a plurality of) channels leading from a first side of the nanoporous mask layer to a second side (e.g. opposite side) of the nanoporous mask layer.

In accordance with another embodiment, a pore density in the nanoporous mask layer may be in the range from about $10^9$ cm$^{-2}$ to about $10^{12}$ cm$^{-2}$, although other values may be possible as well in accordance with other embodiments.

In accordance with another embodiment, forming the nanoporous mask layer over the side of the first layer may include forming a nanoporous alumina ($Al_2O_3$) layer over the side of the first layer.

In accordance with another embodiment, forming the nanoporous alumina layer over the side of the first layer may include or may be achieved by: depositing an aluminum (Al) layer over the side (e.g. top side) of the first layer; and anodic oxidation of the aluminum layer in an acidic electrolyte. Depositing the aluminum layer may, for example, include or may be achieved by means of any suitable deposition process such as, for example, chemical vapor deposition (CVD), physical vapor deposition (PVD), sputter deposition, electroplating, electroless plating, or others, which may be known as such in the art. Anodic oxidation of aluminum as such is described, for example, in "Masuda and K. Fukuda: *"Ordered Metal Nanohole Arrays Made by a Two-Step Replication of Honeycomb Structures of Anodic Alumina"*, Science, Vol. 268, pp. 1466-1468 (1995)" and "H. Masuda, F. Hasegwa and S. Ono: *"Self-Ordering of Cell Arrangement of Anodic Porous Alumina Formed in Sulfuric Acid Solution"*, Journal of the Electrochemical Society 144, L127-30 (1997)", the contents of which are incorporated herein by reference in their entirety. Nanoporous alumina obtained by anodic oxidation may sometimes also be referred to as anodic aluminum oxide (AAO), anodic porous alumina, or anodic alumina.

In accordance with other embodiments, forming the nanoporous alumina layer may include or may be achieved by other suitable processes.

In accordance with another embodiment, forming the nanoporous mask layer over the side of the first layer may include forming a nanoporous polymer layer over the side of the first layer.

In accordance with another embodiment, the nanoporous polymer layer may include or consist of at least one material from a group of materials consisting of: PS-PMMA (poly(styrene)-b-poly(methylmethacrylate)), PEO-b-PS (poly(ethylene oxide)-block-polystyrene diblock copolymer bearing ano-nitrobenzyl carbamate junction), PS-PLA (polystyrene-polylactide). In accordance with other embodiments, other suitable materials may be used.

In accordance with another embodiment, forming the nanoporous polymer layer over the side of the first layer may include or may be achieved by: depositing a block copolymer (BCP) material over the side of the first layer; and selectively etching at least one polymer component (e.g. a minority component) of the block copolymer material, for example by means of chemical etching, thermal etching, photo-chemical etching, or other suitable etch processes in accordance with some embodiments.

In accordance with another embodiment, the block copolymer material may include or may be at least one material from a group of materials, the group consisting of: PS-PMMA (poly(styrene)-b-poly(methylmethacrylate)), PEO-b-PS (poly(ethylene oxide)-block-polystyrene diblock copolymer bearing ano-nitrobenzyl carbamate junction), PS-PLA (polystyrene-polylactide). In accordance with other embodiments, other suitable materials may be used.

In accordance with other embodiments, other suitable processes and/or materials may be used to form the nanoporous mask layer over the side of the first layer.

In accordance with some embodiments, the nanoporous mask layer (for example, the nanoporous alumina layer or the nanoporous polymer layer) may have a thickness in the micrometer range, for example less than or equal to about 300 µm in accordance with an embodiment, for example less than or equal to about 200 µm in accordance with another embodiment, for example less than or equal to about 100 µm in accordance with another embodiment, for example less than or equal to about 50 µm in accordance with another embodiment, for example in the range from about 0.1 µm to about 300 µm in accordance with another embodiment, although other values may be possible as well.

In accordance with another embodiment, the nanoholes in the first layer may have a diameter of less than or equal to about 200 nm, for example less than or equal to about 100 nm in accordance with another embodiment, for example less than or equal to about 50 nm in accordance with another embodiment, for example less than or equal to about 20 nm in accordance with another embodiment, for example less than or equal to about 10 nm in accordance with another embodiment, for example less than or equal to about 5 nm in accordance with another embodiment, for example in the range from about 5 nm to about 200 nm in accordance with another embodiment, for example in the range from about 5 nm to about 100 nm in accordance with another embodiment, for example in the range from about 5 nm to about 50 nm in accordance with another embodiment, for example in the range from about 5 nm to about 20 nm in accordance with another embodiment, for example in the range from about 5 nm to about 10 nm in accordance with another embodiment. In accordance with other embodiments, other values may be possible.

In this context, the term "diameter" may be understood to refer to an extent (e.g., a maximum extent) of the nanoholes in a direction parallel to the side of the first layer, for example a length and/or width of the nanoholes.

In accordance with some embodiments, the diameter of the nanoholes in the first layer may, for example, correspond (or roughly correspond) to a diameter of nanopores or nanoholes of the nanoporous mask layer.

In accordance with some embodiments, the nanoholes in the first layer may have a depth in the micrometer range, for example less than or equal to about 300 µm in accordance with one embodiment, for example less than or equal to about 200 µm in accordance with another embodiment, for example less than or equal to about 100 µm in accordance with another embodiment, for example less than or equal to about 50 µm in accordance with another embodiment, for example less than or equal to about 20 µm in accordance with another embodiment, for example less than or equal to about 10 µm in accordance with another embodiment, for example in the range from about 0.1 µm to about 300 µm in accordance with another embodiment, for example in the range from about 1 µm to about 50 µm in accordance with another embodiment, for example, for example in the range from about 5 µm to about 20 µm in accordance with another embodiment, for example in the range from about 5 µm to about 10 µm in accordance with another embodiment, although other values may be possible as well.

In this context, the term "depth" may be understood to refer to an extent (e.g., a maximum extent) of the nanoholes in a direction perpendicular to the side of the first layer. For example, the "depth" of the nanoholes may refer to a distance between the side (or surface) of the first layer and the bottom of the nanoholes.

In accordance with some embodiments, the number and/or locations and/or lateral dimensions (e.g. diameters) of the nanoholes in the first layer may correspond (or roughly correspond) to the number and/or locations and/or lateral dimensions of nanopores or nanoholes of the nanoporous mask layer. For example, in accordance with some embodiments, the nanoporous mask layer may have an (e.g. regular) array or pattern of nanoholes (such as, for example, shown in FIG. 6), which may, for example, serve as an etch template to create a corresponding array or pattern of nanoholes in the first layer. In other words, the nanohole pattern of the nanoporous mask layer may illustratively be transferred to the first layer by etching.

In accordance with another embodiment, etching the first layer may include or may be achieved by any etch process, e.g. wet etch process, suitable to etch material of the first layer, for example with sufficient selectivity to material or materials of the nanoporous mask layer. Suitable etch processes may be known as such in the art.

As shown in 106, a second layer may be deposited over the side of the first layer after forming the nanoholes. The second layer may fill at least part of the nanoholes and cover at least part of the side of the first layer.

In accordance with an embodiment, the second layer may include or may consist of a metal or metal alloy.

In accordance with another embodiment, the metal or metal alloy may include or may be at least one metal from a group of metals, the group consisting of: aluminum (Al), copper (Cu), gold (Au), silver (Ag), tin (Sn), palladium (Pd), zinc (Zn), nickel (Ni), iron (Fe), or an alloy including or consisting of one or more of the aforementioned metals. In accordance with other embodiments, other suitable metals or metal alloys may be used.

In accordance with another embodiment, the second layer may include or may consist of other materials than a metal or metal alloy, for example other conductive materials in accordance with some embodiments, or insulating materials in accordance with some embodiments. For example, the second layer may include or consist of a glass material, a polymer material, or a ceramic material in accordance with some embodiments, although other materials may be possible as well in accordance with other embodiments.

In accordance with another embodiment, the second layer 106 may fill the nanoholes completely.

In accordance with another embodiment, depositing the second layer may include or may be achieved by means of any suitable deposition process such as, for example, chemical vapor deposition (CVD), physical vapor deposition (PVD), sputter deposition, electroplating, electroless plating, or others, which may be known as such in the art.

In accordance with another embodiment, the second layer may be heated (in other words, tempered or annealed) after depositing the second layer over the side of the first layer; and a third layer may be deposited over the side of the first layer after heating the second layer.

In accordance with another embodiment, the third layer may include or consist of the same material as the second layer, for example the same metal or metal alloy. However, it may also be possible that the second layer and the third layer include or consist of different materials, e.g. different metals or metal alloys. In other words, the material (e.g. metal or metal alloy) of the third layer may be different from the material (e.g. metal or metal alloy) of the second layer.

In accordance with another embodiment, the second layer may be heated to a temperature that is greater than or equal to a melting temperature of nanocrystals (e.g. metal nanocrystals) that may have been formed in the nanoholes by the deposition of the second layer. In other words, depositing the second layer may have led to formation of nanocrystals (e.g. metal nanocrystals) (in other words, nanocrystals of the material (e.g. metal or metal alloy) contained in the second layer) in the nanoholes, and the nanocrystals (e.g. metal nanocrystals) may be melted by heating the second layer up to the melting temperature (or above the melting temperature) of the nanocrystals (e.g. metal nanocrystals).

In this connection, one aspect of various embodiments may be seen in that the melting temperature of nanocrystals of a material (e.g. metal or metal alloy) may be lower than the melting temperature of a bulk sample (e.g. a sample having macroscopic dimensions) of that material (e.g. metal or metal alloy), and may in general depend on the size of the nanocrystals, for example decrease with decreasing size of the nanocrystals. For example, spherical copper nanoparticles of about 40 nm diameter may have a melting temperature of about 200° C., which is about one fifth the melting temperature of copper bulk material. Thus, the melting point of a material (e.g. metal) may be reduced when filled in the nanostructures or nanoholes (e.g. nanocavities or nanopores) in the first layer.

One aspect of various embodiments may be seen in that the reduction of the melting point (melting temperature) of nanocrystals may be exploited in filling nanopores at much lower temperature. For example, it may be possible to completely fill the nanostructures or nanoholes (e.g. nanocavities or nanopores) in the first layer with metals or metal alloys by repeated heating and filling steps at much lower temperatures compared to the bulk melting point of the metals or metal alloys. The same may apply in case of other filling materials than metals or metal alloys.

In accordance with another embodiment, the second layer (or a surface of the second layer, e.g. a surface facing away from the first layer) may be cleaned before heating the second layer.

The method 100, or parts thereof, may alternatively or additionally be configured in accordance with further embodiments described herein.

Figure 2:
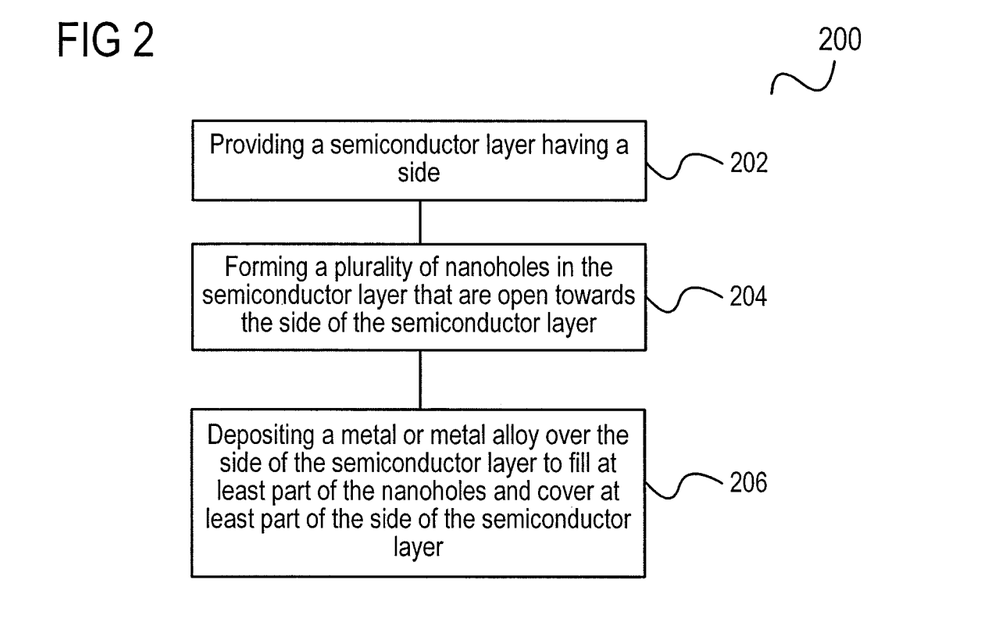
FIG. 2 shows a method for manufacturing a layer arrangement in accordance with various embodiments.

FIG. 2 shows a method 200 for manufacturing a layer arrangement in accordance with various embodiments.

As shown in 202, a semiconductor layer having a side may be provided.

As shown in 204, a plurality of nanoholes (e.g. nanocavities or nanopores) may be formed in the semiconductor layer that are open towards the side of the semiconductor layer.

As shown in 206, a metal or metal alloy may be deposited over the side of the semiconductor layer to fill at least part of the nanoholes and cover at least part of the side of the semiconductor layer.

In accordance with an embodiment, forming the plurality of nanoholes in the semiconductor layer may include or may be achieved by forming a nanoporous mask layer over the side of the semiconductor layer; and etching the semiconductor layer using the nanoporous mask layer as an etch mask.

In accordance with another embodiment, the nanoporous mask layer may include or consist of nanoporous alumina or a nanoporous polymer material.

In accordance with another embodiment, forming the nanoporous mask layer may include or may be achieved by depositing an aluminum layer over the side of the semiconductor layer; and anodic oxidation of the aluminum layer in an acidic electrolyte to form a nanoporous alumina layer.

In accordance with another embodiment, forming the nanoporous mask layer over the side of the semiconductor layer may include or may be achieved by: depositing a block copolymer material over the side of the semiconductor layer; and selectively etching at least one polymer component of the block copolymer material to form a nanoporous polymer layer.

In accordance with another embodiment, the metal or metal alloy may be heated after depositing the metal or metal alloy over the side of the semiconductor layer; and further metal or metal alloy may be deposited over the semiconductor layer after heating the metal or metal alloy.

In accordance with another embodiment, the metal or metal alloy (or a surface of the metal or metal alloy, e.g. a surface facing away from the semiconductor layer) may be cleaned before heating the metal or metal alloy.

In accordance with another embodiment, the metal or metal alloy and the further metal or metal alloy may include or consist of the same metal or metal alloy. However, it may also be possible that the metal or metal alloy and the further metal or metal alloy include or consist of different metals or metal alloys. In other words, the further metal or metal alloy may be different from the metal or metal alloy.

In accordance with another embodiment, providing the semiconductor layer may include providing a semiconductor substrate, for example a wafer, wherein the semiconductor layer is part of the semiconductor substrate (e.g. wafer). The wafer may for example be a silicon wafer, although other types of wafers may be possible as well in accordance with some embodiments.

In accordance with another embodiment, the surface of the semiconductor layer may be a backside of the wafer.

In accordance with another embodiment, the semiconductor layer may include or may be an electrical terminal region, for example a source/drain region of a transistor. In this case, the metal or metal alloy and/or the further metal or metal alloy may, for example, form an electrical contact (e.g. source/drain metal contact) to the electrical terminal region.

The method 200, or parts thereof, may alternatively or additionally be configured in accordance with further embodiments described herein.

Figure 3:
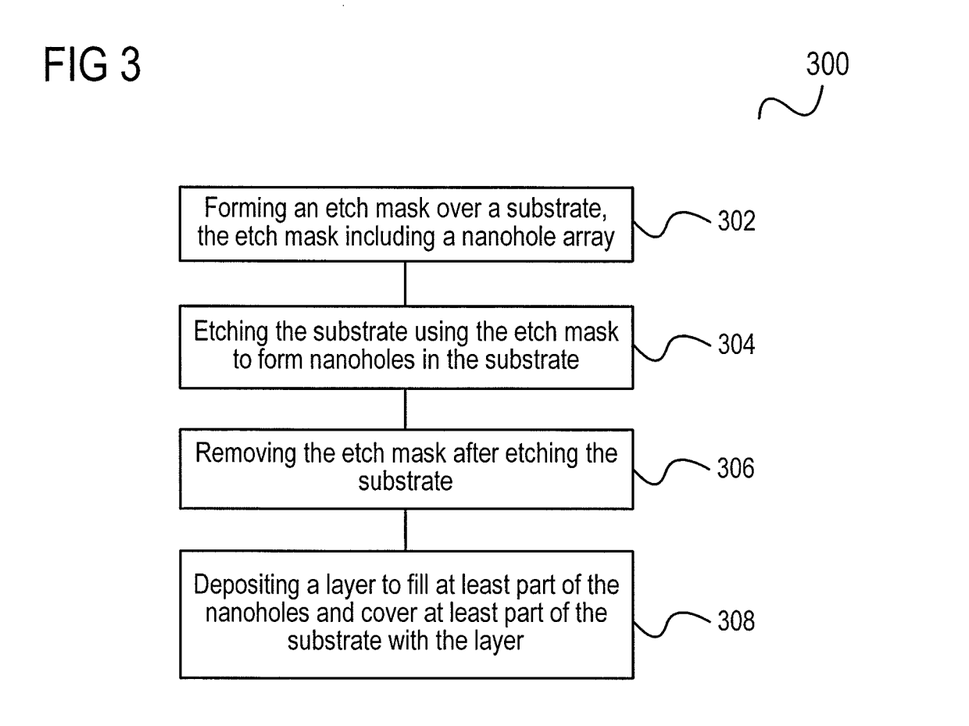
FIG. 3 shows a method for manufacturing a layer arrangement in accordance with various embodiments.

FIG. 3 shows a method 300 for manufacturing a layer arrangement in accordance with various embodiments.

As shown in 302, an etch mask may be formed over a substrate, the etch mask including a nanohole array.

As shown in 304, the substrate may be etched using the etch mask to form nanoholes (e.g. nanocavities or nanopores) in the substrate.

As shown in 306, the etch mask may be removed after etching the substrate.

As shown in 308, a layer may be deposited to fill at least part of the nanoholes and cover at least part of the substrate with the layer.

In accordance with an embodiment, the etch mask may include or may consist of porous alumina or a porous polymer material.

In accordance with another embodiment, the substrate may be a semiconductor substrate, for example a wafer, for example a silicon wafer, although other types of wafers may be possible as well in accordance with some embodiments.

In accordance with another embodiment, the layer may include or consist of a metal or metal alloy.

In accordance with another embodiment, forming the etch mask over the substrate may include forming the etch mask over a backside of the wafer.

In accordance with another embodiment, the metal or metal alloy may be configured as a backside metallization of the wafer.

The method 300, or parts thereof, may alternatively or additionally be configured in accordance with further embodiments described herein.

FIGS. 4A to 4F show cross-sectional views illustrating a method for manufacturing a layer arrangement in accordance with various embodiments.

Figure 4A:
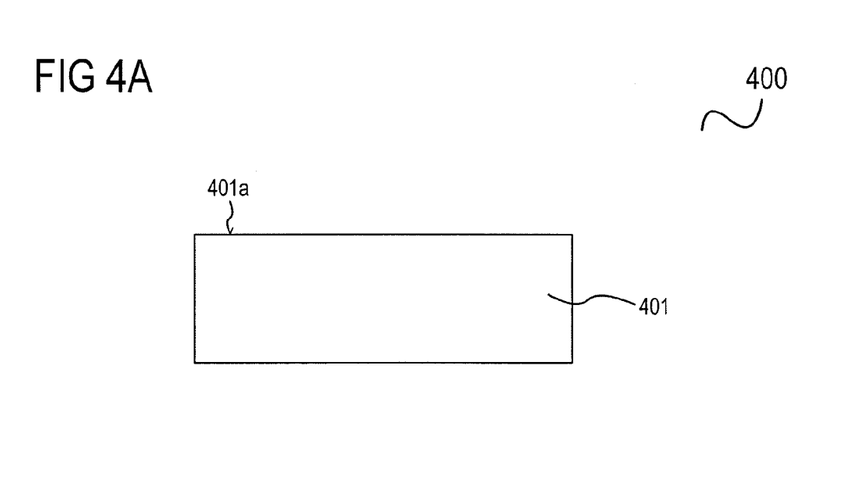
FIGS. 4A to 4F show cross-sectional views illustrating a method for manufacturing a layer arrangement in accordance with various embodiments.

FIG. 4A shows, in a view 400, that a first layer 401 may be provided. The first layer 401 may have a side 401a.

The first layer 401 may include or may consist of a semiconductor material such as, for example, silicon. For example, the first layer 401 may be a semiconductor layer, e.g. a silicon layer. Alternatively or in addition, the first layer 401 may include or consist of other semiconductor materials (including compound semiconductor materials, e.g. binary, ternary, quaternary, . . . , compound semiconductors) such as, for example, germanium, silicon germanium, a IV-IV compound semiconductor material, a III-V compound semiconductor material, a II-VI compound semiconductor material, or others.

In accordance with an embodiment, the first layer 401 may be part of a semiconductor substrate (or may be a semiconductor substrate) such as, for example, a wafer, e.g. a silicon wafer, although other types of wafers may be possible as well in accordance with some embodiments.

In accordance with another embodiment, the side 401a of the first layer 401 may be a backside of the semiconductor substrate, e.g. a backside of the wafer, e.g. a backside of the silicon wafer.

In accordance with another embodiment, the first layer 401 may be or correspond to an active layer or region in the semiconductor substrate, e.g. the wafer.

In accordance with another embodiment, the side 401a of the first layer 401 may correspond to or may be a main processing surface of the semiconductor substrate, e.g. the wafer.

In accordance with another embodiment, the first layer 401 may include or may be an electrical terminal region, for example an electrical terminal region of an electronic device, for example a source/drain region of a transistor.

Figure 4B:
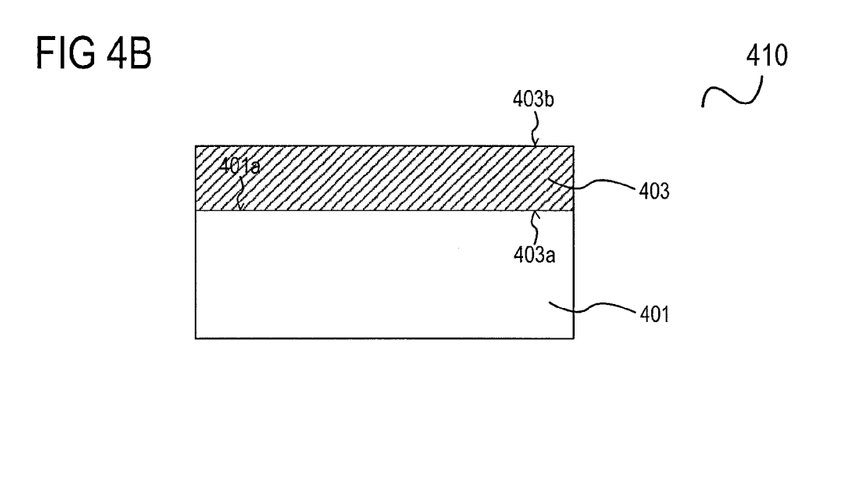

FIG. 4B shows, in a view 410, that aluminum may be deposited over the side 401a of the first layer 401 to form an aluminum layer 403 over the side 401a of the layer 401. The aluminum layer 403 may have a first side 403a that may face towards the side 401a of the first layer 401. Furthermore, the aluminum layer 403 may have a second side 403b that may face away from the side 401a of the first layer 401. The first and second sides 403a, 403b of the aluminum layer 403 may be opposite sides of the aluminum layer 403, as shown.

Figure 4C:
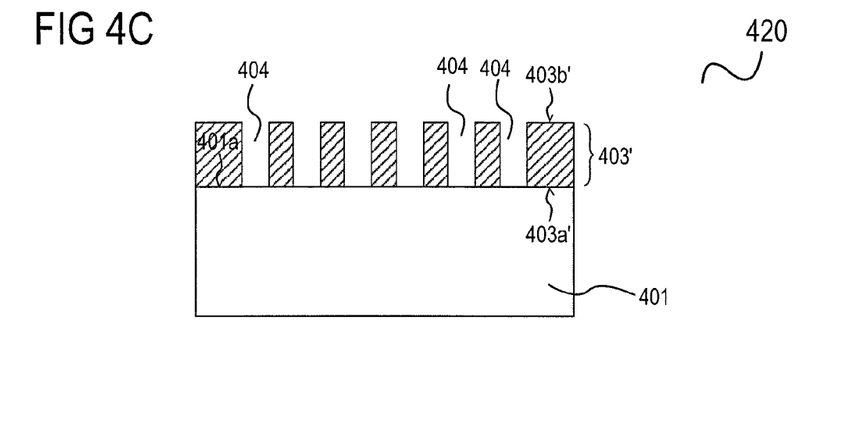

FIG. 4C shows, in a view 420, that a nanoporous alumina layer 403' may be formed from the aluminum layer 403. The nanoporous alumina layer 403' may be formed from the aluminum layer 403 by means of anodic oxidation of the aluminum layer 403 in an acidic electrolyte. Thus, the nanoporous alumina layer 403' may also be referred to as anodic aluminum oxide (AAO) layer.

The nanoporous alumina layer 403' may include a plurality of nanopores or nanoholes 404 (six nanopores are shown as an example, however the number of nanopores may be different from, e.g. larger than, six; in accordance with some embodiments, the nanoporous alumina layer 403' may, for example, include tens, hundreds, or thousands, or even more nanoholes 404; for example, in accordance with one embodiment, the nanohole density may be in the range from about $10^9$ cm$^{-2}$ to about $10^{12}$ cm$^{-2}$, although other values may be possible as well in accordance with other embodiments.). The nanopores or nanoholes 404 (or at least some of the nanopores or nanoholes 404) may lead from a first side 403a' of the nanoporous alumina layer 403' (corresponding to the first side 403a of the aluminum layer 403) to a second side 403b' of the nanoporous alumina layer 403' (corresponding to the second side of the aluminum layer 403). In other words, the nanopores or nanoholes 404 (or at least some of the nanopores or nanoholes 404) may form channels in the alumina layer 403'.

The nanopores or nanoholes 404 may, for example, be arranged to form a regular array (nanohole array). For example, in accordance with some embodiments, the nanoporous alumina layer 403' may have a packed array of columnar hexagonal cells with central, cylindrical, uniformly sized nanoholes 404. The nanoholes 404 may, for example, range from about 4 nm to about 200 nm in diameter in accordance with some embodiments, although other diameters may be possible as well in accordance with other embodiments. Illustratively, the nanoporous alumina layer 403' obtained from the aluminum layer 403 may have a self-ordered pore structure, as illustrated in FIG. 6.

Figure 6:
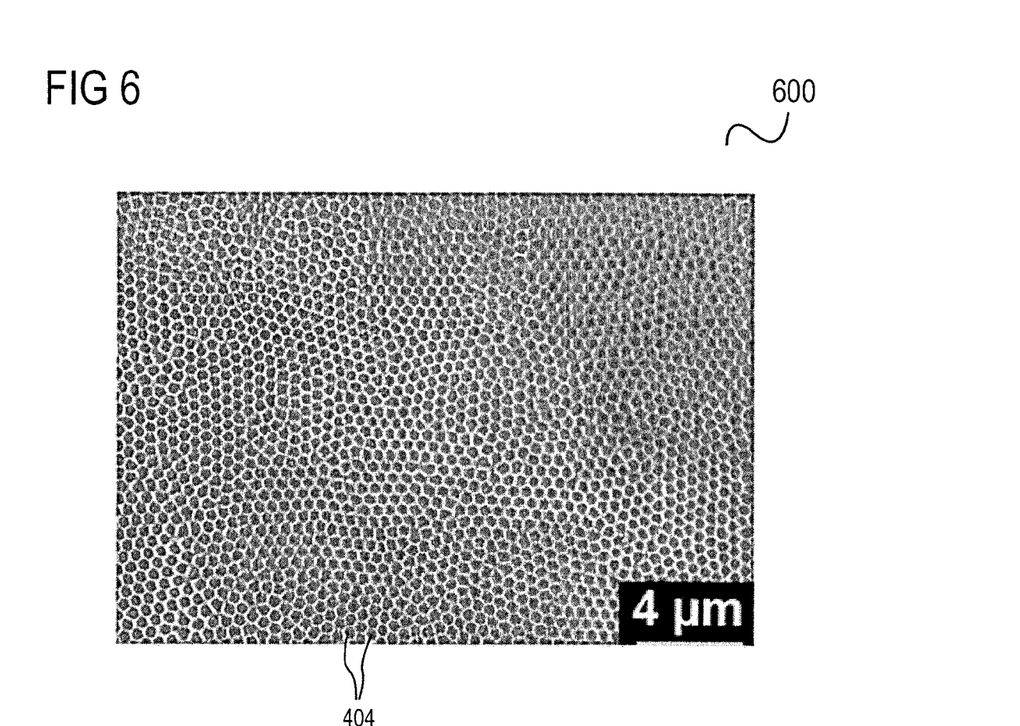
FIG. 6 shows a scanning electron micoscropy image for illustrating an aspect of various embodiments.

FIG. 6 shows a scanning electron microscopy image 600 of self-ordered porous alumina containing a plurality of nanopores or nanoholes 404. As may be seen, the nanopores or nanoholes 404 of the porous alumina may be arranged in a well-ordered array and may have a substantially uniform size (e.g. narrow size distribution).

The nanoporous alumina layer 403' in FIG. 4C may constitute a nanoporous mask layer that may serve as an etch mask in an etch process to form nanoholes (e.g. nanocavities or nanopores) in the first layer 401, as will be described below. In accordance with other embodiments, a similar nanoporous mask layer or etch mask may be obtained using nanoporous templates other than a nanoporous alumina layer, for example nanoporous polymer layers, e.g. based on ordered block copolymers (BCP), or other suitable nanoporous materials having e.g. an ordered nanohole array.

Figure 4D:
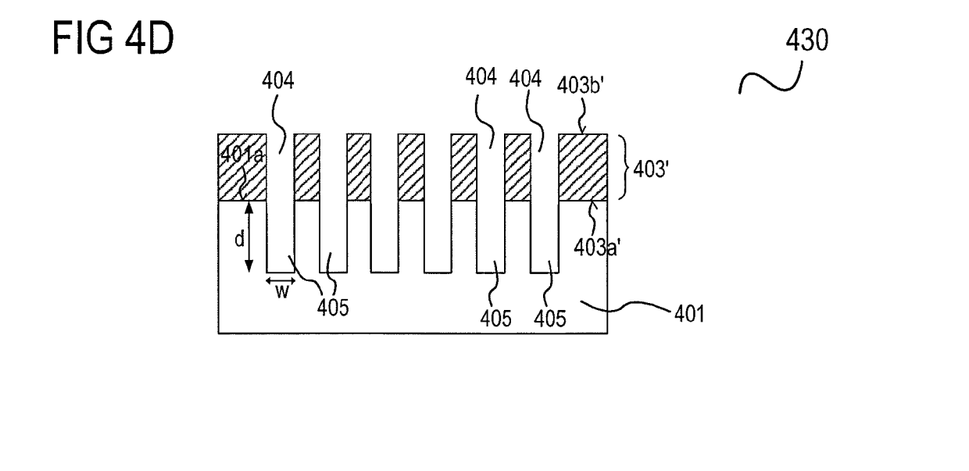

FIG. 4D shows, in a view 430, that the first layer 401 may be etched using the nanoporous mask layer (i.e. the nanoporous alumina layer 403' in this embodiment) as an etch mask. Thus, one or more nanoholes 405 (e.g. nanocavities or nanopores) may be formed in the first layer 401. The number and locations of the nanoholes 405 may correspond (or roughly correspond) to the number and locations of the nanopores or nanoholes 404 of the nanoporous alumina layer 403', as shown.

The nanoholes 405 may have a diameter "w" and a depth "d", as shown. Values of the diameter "w" and/or depth "d" may be in the nanometer range, and may for example be similar or the same as in embodiments described herein above in connection with FIG. 1, although other values may be possible as well in accordance with some embodiments. The diameter "w" of the nanoholes 405 in the first layer 401 may correspond (or roughly correspond) to a diameter of the nanopores or nanoholes 404 of the nanoporous alumina layer 403. In accordance with some embodiments, the diameter "w" of the nanoholes 405 in the first layer 401 may, for example, be slightly larger than the diameter of the nanopores or nanoholes 404, however this need not necessarily be the case.

Figure 4E:
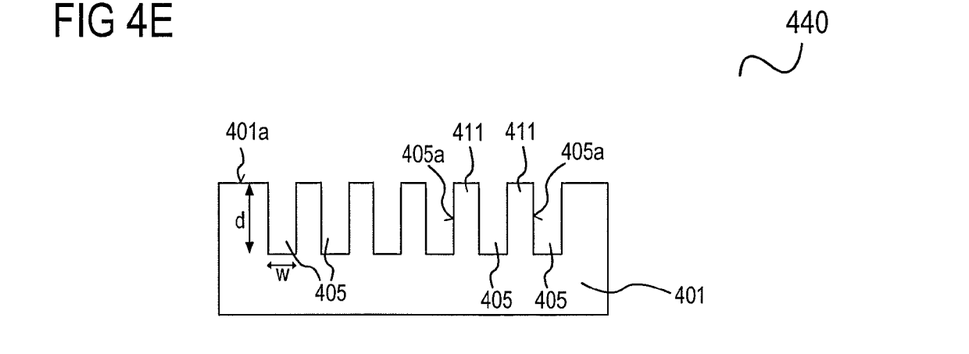

FIG. 4E shows, in a view 440, that the nanoporous alumina layer 403' may be removed after etching the first layer 401, thus leaving the first layer 401 having the nanoholes 405. The nanoholes 405 may be separated from one another by material of the first layer 401 remaining between the nanoholes 405 after the etching of the first layer 401. The remaining material of the first layer 401 may, for example, form ridges or ridge-like structures 411 between the nanoholes 405.

In some embodiments, the nanoholes 405 may have a cylindrical or substantially cylindrical shape. In one or more embodiments, a cross-sectional profile of sidewalls 405*a* of the nanoholes 405 may have a straight or substantially straight shape.

As may be seen, the nanoholes 405 are open towards the side 401*a* of the first layer 401. Thus, the nanoholes 405 may be filled at least partially with material of a second layer to be deposited later, as will be described below.

Figure 4F:
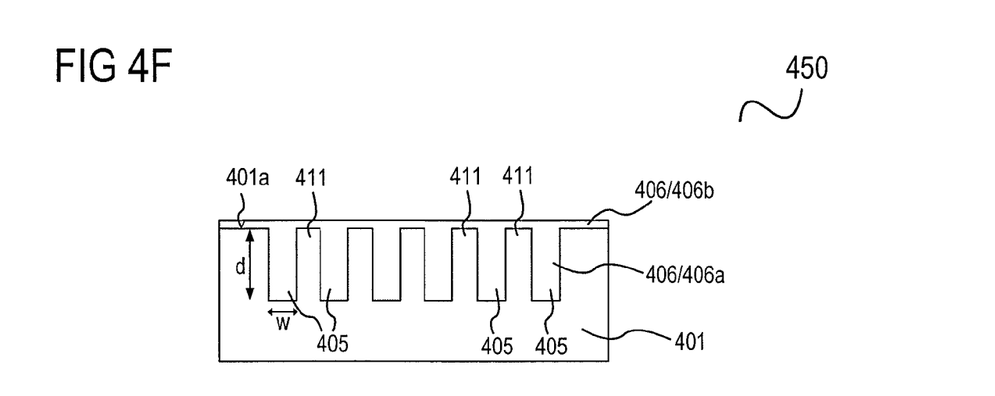

FIG. 4F shows, in a view 450, that a second layer 406 may be deposited over the side 401*a* of the first layer 401. In accordance with the embodiment shown, the second layer 406 may include a metal or metal alloy. In other words, a metal or metal alloy may be deposited over the side 401*a* of the first layer 401 to form the second layer 406. In accordance with some embodiments, the metal or metal alloy of the second layer 406 may include or may be aluminum (Al), copper (Cu), gold (Au), silver (Ag), tin (Sn), palladium (Pd), zinc (Zn), nickel (Ni), iron (Fe), or an alloy including or consisting of one or more of the aforementioned metals, however alternatively or in addition, the second layer 406 may include or consist of other metals or metal alloys as well.

The second layer 406 (or, a first part 406*a* of the second layer 406) may fill at least part of the nanoholes 405. In addition, the second layer 406 (or, a second part 406*b* of the second layer 406) may cover at least part of the side 401*a* of the first layer 401.

The second layer 406, or the metal or metal alloy of the second layer 406, may be deposited using any suitable deposition process including, for example, chemical vapor deposition (CVD), physical vapor deposition (PVD), sputter deposition, electroplating, and electroless plating.

For example in case that the side 401*a* of the first layer 401 is a backside of a wafer, the second layer 406 may include or may be configured, for example, as a backside metallization of the wafer. Or, for example in case that the first layer 401 includes or is an electrical terminal region, e.g. a source/drain region, the second layer 406 may include or may be configured, for example, as an electrical contact (e.g. a source/drain metal contact) to the electrical terminal region.

One aspect of layer arrangements in accordance with one or more embodiments described herein, e.g. the layer arrangement shown in FIG. 4F, may be seen in that the second layer 406 filling the nanoholes 405 may create a physical interlocking effect between the second layer 406 and the first layer 401, which may lead to increased adhesion of the second layer 406 to the first layer 401.

Another aspect of layer arrangements in accordance with one or more embodiments described herein, e.g. the layer arrangement shown in FIG. 4F, may be seen in that the second layer 406 filling the nanoholes 405 may have an increased surface to volume ratio compared to a surface to volume ratio of a layer having a planar surface. For example, in accordance with some embodiments, the surface to volume ratio of the second layer 406 may be several orders of magnitude higher compared to the surface to volume ratio of a planar layer having the same volume.

Another aspect of layer arrangements in accordance with various embodiments described herein, e.g. the layer arrangement shown in FIG. 4F, may be seen in that the increased surface to volume ratio may, for example, be used to achieve improved heat transfer from the first layer to the second layer. For example, in accordance with some embodiments, the first layer 401 may include or may be a semiconductor layer (e.g. silicon layer) of a chip, and the second layer 406 may include or may be a backside metallization of the chip, and the high surface to volume ratio of the backside metallization may be used to achieve improved heat transfer from the semiconductor material (e.g. silicon) of the chip to the backside metal.

Another aspect of one or more embodiments described herein, e.g. the layer arrangement shown in FIG. 4F, may be seen in that the increased surface to volume ratio may, for example, be used to achieve reduced ohmic resistance between an electrical terminal region (e.g. a source/drain region) of a device and an electrical contact (e.g. source/drain metal contact) to the electrical terminal region. For example, in accordance with some embodiments, the first layer 401 may include or may be an electrical terminal region (e.g. source/drain region of a transistor), and the second layer 406 may include or may be an electrical contact (e.g. source/drain metal contact), and the high surface to volume ratio of the electrical contact may be used to achieve a reduced ohmic resistance between the electrical terminal region and the electrical contact. Thus, it may, for example, be possible that polysilicon deposition at source/drain regions may be avoided in accordance with some embodiments.

Figure 7:
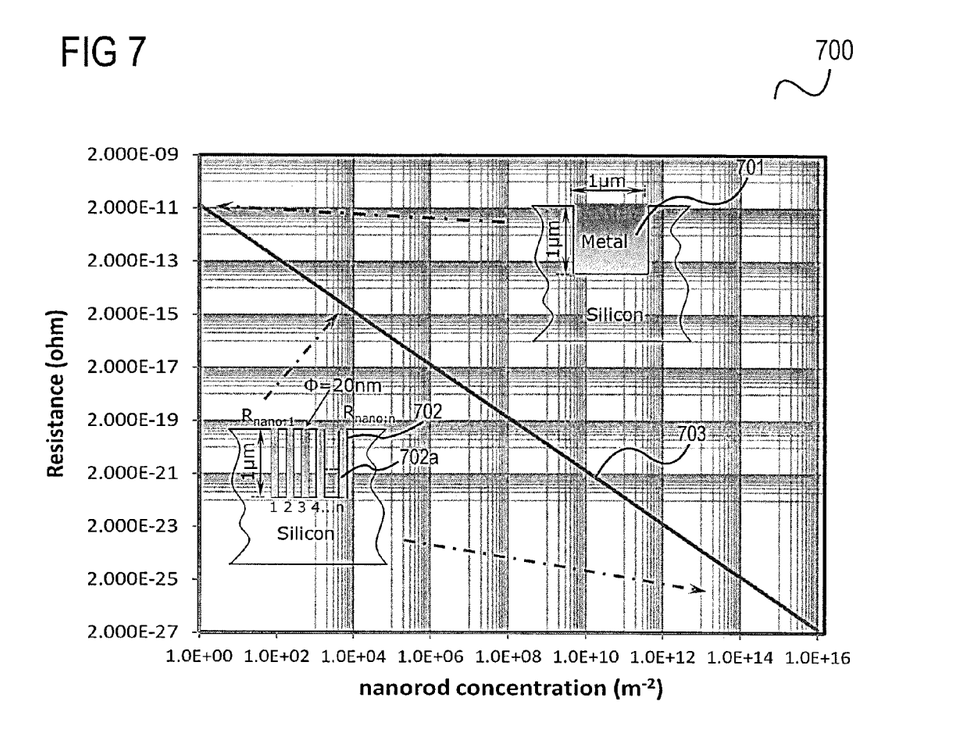
FIG. 7 shows a diagram for illustrating an aspect of one or more embodiments.

FIG. 7 shows a diagram 700 for illustrating the aforementioned aspect, i.e. reducing ohmic resistance by increasing the surface to volume ratio of an electrical contact.

FIG. 7 shows a comparison of the electrical resistance of a bulk metal plug 701 with the electrical resistance of a metal plug 702 including a plurality of nanorods 702*a*, hereinafter referred to as nanostructured metal plug 702. The bulk metal plug 701 is made of copper (resistivity of Cu being $1.68 \times 10^{-10}$ Ωm) and has a cylindrical geometry with a diameter of 1 μm and a depth of 1 μm. The nanostructured metal plug 702 includes a plurality of nanorods 702*a* made of copper, wherein each nanorod 702*a* has a cylindrical geometry with diameter Φ=20 nm and a depth of 1 μm. Curve 703 plots an electrical resistance of the bulk metal plug 701 and an electrical resistance of a nanostructured metal plug 702 for different nanorod concentrations (number of nanorods 702*a* per unit area).

FIG. 7 shows that the electrical resistance of the nanostructured metal plug 702 is lower than the electrical resistance of the bulk metal plug 701 and decreases with increasing nanorod concentration. The reason for this may be seen in the increase of the surface to volume ratio of the metal plug 702 with increasing nanorod concentration (i.e. increasing number of nanorods 702*a* per unit area).

As shown in FIG. 4F, in accordance with various embodiments, the second layer 406, or the metal or metal alloy of the second layer 406, may fill the nanoholes 405 (or at least some of the nanoholes 405) completely, as shown. That is, the first part 406*a* of the second layer 406 disposed in at least some of the nanoholes 405 and the second part 406*b* of the second layer 406 covering the side 401*a* of the first layer 401 may be contiguous, as shown. In other words, the second layer 406 filling the nanoholes 405 and covering the side 401*a* of the first layer 401 may be free or substantially free of voids.

In accordance with some embodiments, it may be possible that the second layer 406 fills the nanoholes 405 (or at least some of the nanoholes 405) partially, wherein further processing may be carried out to fill the nanoholes 405 completely, as will be described below.

FIGS. 5A to 5D show cross-sectional views illustrating a method for manufacturing a layer arrangement in accordance with various embodiments. Reference signs that are the same as in FIGS. 4A to 4F denote the same elements as there and will not be described in detail again here, reference is made to the description above.

Figure 5A:
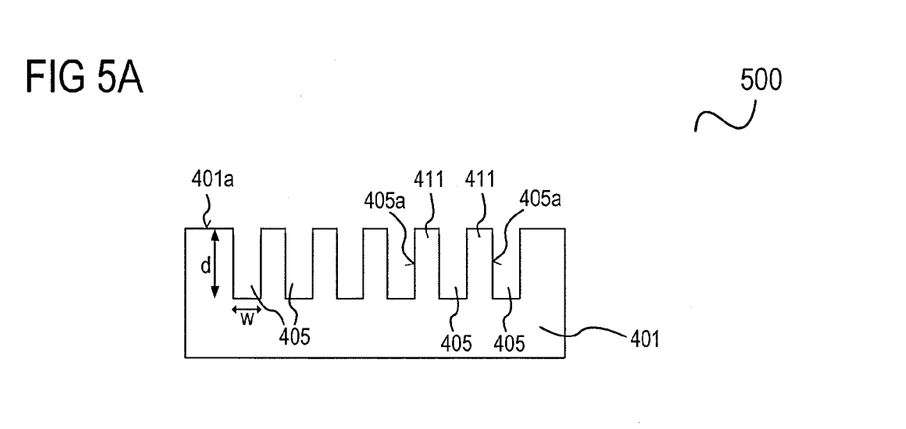
FIGS. 5A to 5D show cross-sectional views illustrating a method for manufacturing a layer arrangement in accordance with various embodiments.

FIG. 5A shows, in a view 500, that a first layer 401 having a side 401a may be provided, and one or more nanoholes 405 may be formed in the first layer 401, for example in a similar as described herein above in connection with FIGS. 4A to 4E, or in accordance with other embodiments described herein.

Figure 5B:
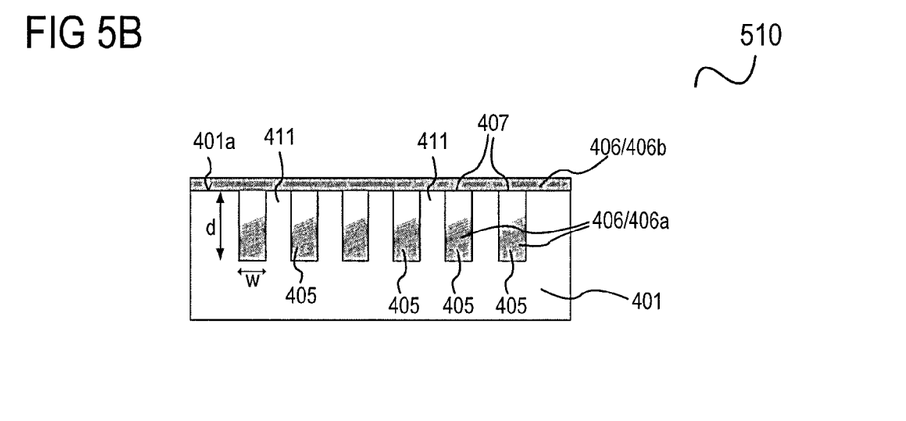

FIG. 5B shows, in a view 510, that a second layer 406 may be deposited over the side 401a of the first layer 401, wherein the second layer 406 includes a metal or metal alloy. In other words, a metal or metal alloy may be deposited over the side 401a of the first layer 401 to form the second layer 406.

In accordance with some embodiments, the metal or metal alloy of the second layer 406 may include or may be aluminum (Al), copper (Cu), gold (Au), silver (Ag), tin (Sn), palladium (Pd), zinc (Zn), nickel (Ni), iron (Fe), or an alloy including one or more of the aforementioned metals, however alternatively or in addition, the second layer 406 may include or consist of other metals or metal alloys as well.

The second layer 406 (or, a first part 406a of the second layer 406) may fill at least part of the nanoholes 405. In addition, the second layer 406 (or, a second part 406b of the second layer 406) may cover at least part of the side 401a of the first layer 401.

The second layer 406, or the metal or metal alloy of the second layer 406, may be deposited using any suitable deposition process including, for example, chemical vapor deposition (CVD), physical vapor deposition (PVD), sputter deposition, electroplating, and electroless plating.

As shown, the second layer 406 may fill the nanoholes 405 (or at least some of the nanoholes 405) partially. For example, the first part 406a of the second layer 406 disposed in at least some of the nanoholes 405 and the second part 406b of the second layer 406 covering the side 401a of the first layer 401 may be non-contiguous, as shown. That is, the second layer 406 filling the nanoholes 405 and covering the side 401a of the first layer 401 may include one or more voids 407.

Figure 5C:
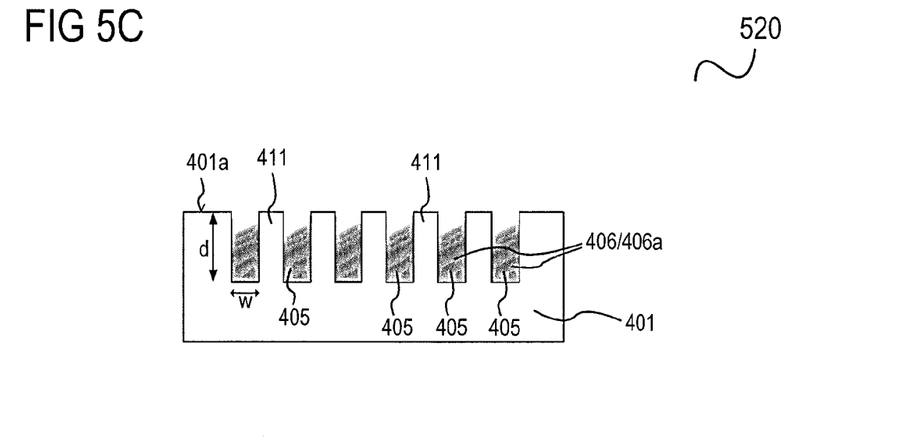

FIG. 5C shows, in a view 520, that the second layer 406 (or the second part 406b of the second layer 406 covering the side 401a of the first layer 401, illustratively the surface metal layer), may be cleaned in accordance with some embodiments. This may, for example, include removing the second part 406b of the second layer 406 covering the side 401a of the first layer 401, as shown.

Furthermore, in accordance with some embodiments, the second layer 406 (or the first part 406a of the second layer 406 disposed in the nanoholes 405) may be heated to melt nano crystals in the nanoholes 405.

For example, the second layer 406 may be heated to a temperature that is greater than or equal to a melting temperature of metal nanocrystals that may have been formed in the nanoholes 405 by the deposition of the second layer 406. In other words, depositing the second layer 406, which includes or consists of a metal or metal alloy, may have led to formation of metal nanocrystals (in other words, nanocrystals of the metal or metal alloy of the second layer 406) in the nanoholes 405, and the metal nanocrystals may be melted by heating the second layer 406 up to the melting temperature (or above the melting temperature) of the metal nanocrystals.

As mentioned above, it should be noted that the melting temperature of nanocrystals of a material (e.g. metal or metal alloy) may be lower than the melting temperature of a bulk sample (e.g. a sample having macroscopic dimensions) of that material (e.g. metal or metal alloy), and may in general depend on the size of the nanocrystals, and may in particular decrease with decreasing size of the nanocrystals.

Figure 8:
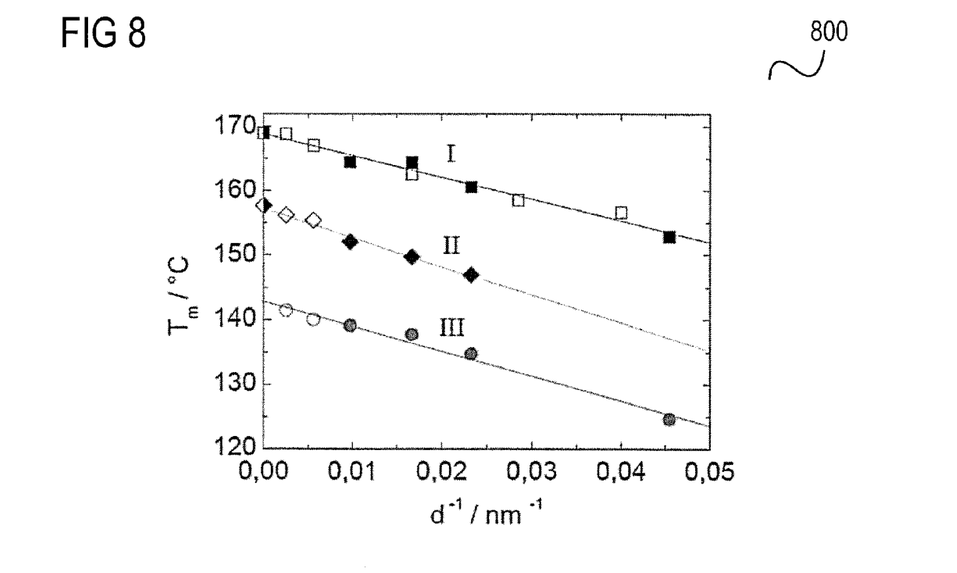
FIG. 8 shows a diagram for illustrating an aspect of one or more embodiments.

FIG. 8 shows a diagram 800 illustrating the aforementioned aspect, i.e. dependence of the melting temperature on sample size.

Diagram 800 shows melting temperatures $T_m$ of three different samples (I, II, and III) of paracetamol in nanocrystalline form and with varying diameters d of the nanocrystals. As may be seen, the melting temperature $T_m$ in each case decreases roughly linearly with the inverse 1/d of the nanocrystal diameter d. The decrease of $T_m$ with diameter d may be modeled using the so-called Gibbs Thomson equation:

$$T_m(d) = T_m^\infty - \frac{4 T_m^\infty \sigma_c}{d \Delta H_m^\infty \rho_c},$$

wherein $\sigma_c$ denotes the surface tension, $\Delta H_m^\infty$ denotes the enthalpy of melting, and $\rho_c$ denotes the crystal density.

In accordance with some embodiments, further metal or metal alloy may be deposited after heating the second layer 406. The metal or metal alloy may be the same as that of the second layer 406 (i.e. the metal or metal alloy of the second layer 406 may be redeposited). However, alternatively or in addition a different metal or metal alloy may be deposited as well in accordance with some embodiments.

Figure 5D:
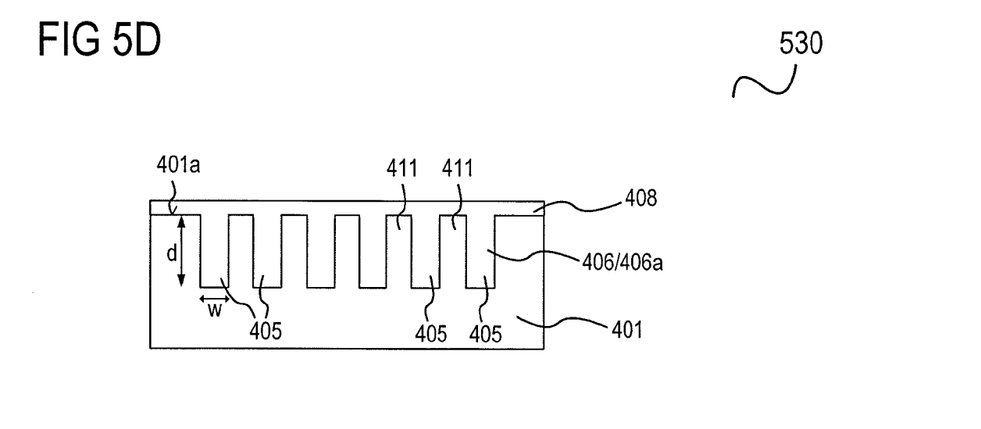

Deposition of further metal or metal alloy may lead to further filling of the nanoholes 405, as shown in FIG. 5C, and to final filling of the nanoholes 405 and covering at least part of the side 401a of the first layer 401 with the metal or metal alloy, as shown in FIG. 5D in a view 530. Illustratively, a third layer 408 containing or consisting of the same (or different) metal or metal alloy may be deposited over the side 401a of the first layer 401. The third layer 408 may serve to completely fill the nanoholes 405 (or at least some of the nanoholes 405) and to cover at least part of the side 401a of the first layer 401, as shown. For example, the second layer 406 and the third layer 408 may form a contiguous metal layer or metal alloy layer in accordance with some embodiments.

In accordance with some embodiments, it may be possible to iterate some or all of the processes described above in connection with FIGS. 5C and 5D, i.e. cleaning the surface of the deposited metal or metal alloy, heating the metal nanocrystals in the nanoholes to melt the nanocrystals, and redepositing metal or metal alloy, to obtain complete filling of the nanoholes with metal or metal alloy.

FIGS. 9A to 9D show cross-sectional views illustrating a method for manufacturing a layer arrangement in accordance with various embodiments. Reference signs that are the same as in FIGS. 4A to 4F and/or in FIGS. 5A to 5D denote the same elements as there and will not be described in detail again here, reference is made to the description above.

Figure 9A:
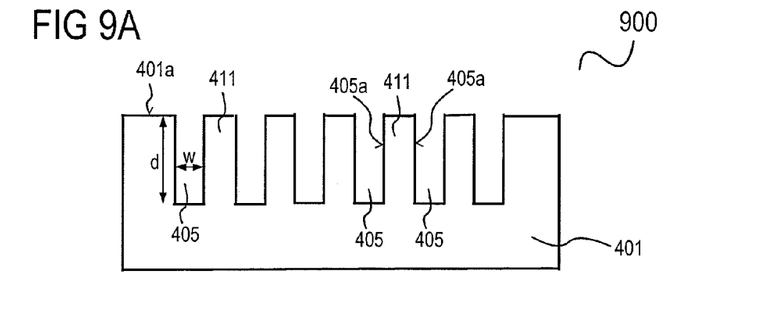
FIGS. 9A to 9D show cross-sectional views illustrating a method for manufacturing a layer arrangement in accordance with various embodiments.

FIG. 9A shows, in a view 900, that a first layer 401 having a side 401a may be provided, and one or more nanoholes 405 may be formed in the first layer 401, for example in a similar as described herein above in connection with FIGS. 4A to 4E, or in accordance with other embodiments described herein.

As shown in FIG. 9A, the nanoholes 405 may have straight or substantially straight sidewalls 405a in accordance with the embodiment shown in FIG. 9A. For example, a cross-sectional profile of the sidewalls 405a of the nanoholes 405 may have a straight or substantially straight shape.

Figure 9B:
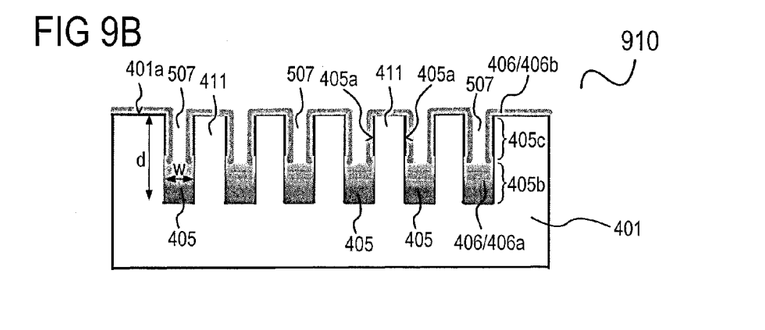

FIG. 9B shows, in a view 910, that a second layer 406 may be deposited over the side 401a of the first layer 401, wherein the second layer 406 includes a metal or metal alloy. In other words, a metal or metal alloy may be deposited over the side 401a of the first layer 401 to form the second layer 406.

In accordance with some embodiments, the metal or metal alloy of the second layer 406 may include or may be aluminum (Al), copper (Cu), gold (Au), silver (Ag), tin (Sn), palladium (Pd), zinc (Zn), nickel (Ni), iron (Fe), or an alloy including one or more of the aforementioned metals, however alternatively or in addition, the second layer 406 may include or consist of other metals or metal alloys as well.

The second layer 406 (or, a first part 406a of the second layer 406) may fill at least part of the nanoholes 405, for example a lower portion 405b of the nanoholes 405. In addition, the second layer 406 (or, a second part 406b of the second layer 406) may cover at least part of the side 401a of the first layer 401. Furthermore, the second layer 406 (or, the second part 406b of the second layer 406) may cover a portion of the sidewalls 405a of the nanoholes 405, for example an upper portion 405c of the sidewalls 405a of the nanoholes 405, as shown.

The second layer 406, or the metal or metal alloy of the second layer 406, may be deposited using any suitable deposition process including, for example, chemical vapor deposition (CVD), physical vapor deposition (PVD), sputter deposition, electroplating, and electroless plating.

As shown, the second layer 406 may fill the nanoholes 405 (or at least some of the nanoholes 405) partially. For example, an upper portion of the nanoholes 405 corresponding to the upper portion 405c of the sidewalls 405a of the nanoholes 405 may be not completely filled with the second layer 406. In other words, the first part 406a of the second layer 406 disposed in at least some of the nanoholes 405 and the second part 406b of the second layer 406 covering the side 401a of the first layer 401 and the upper portion 405c of the sidewalls 405a of the nanoholes 405 may be arranged such that gaps 507 remain in the nanoholes 405.

Figure 9C:
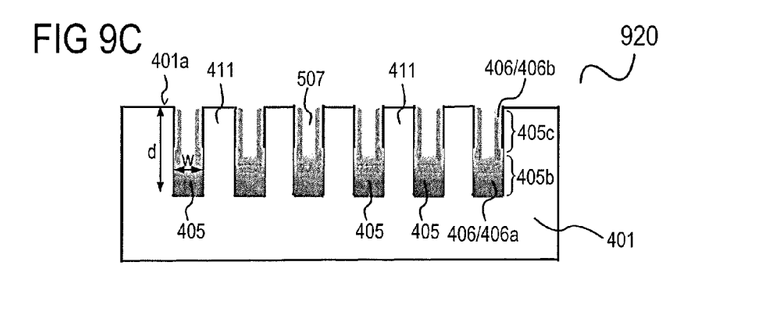

FIG. 9C shows, in a view 920, that the second layer 406, for example the surface metal layer (or that part of the second part 406b of the second layer 406 covering the side 401a of the first layer 401), may be cleaned in accordance with some embodiments. This may, for example, include removing that part of the second part 406b of the second layer 406 that covers the side 401a of the first layer 401, as shown.

Furthermore, in accordance with some embodiments, the second layer 406 (or the first part 406a of the second layer 406 disposed in the nanoholes 405 and that part of the second part 406b of the second layer 406 that covers the upper portion 405c of the sidewalls 405a of the nanoholes 405) may be heated to melt nano crystals in the nanoholes 405, for example similarly as described above in connection with FIG. 5C.

In accordance with some embodiments, further metal or metal alloy may be deposited after heating the second layer 406. The metal or metal alloy may be the same as that of the second layer 406 (i.e. the metal or metal alloy of the second layer 406 may be redeposited). However, alternatively or in addition a different metal or metal alloy may be deposited as well in accordance with some embodiments.

Figure 9D:
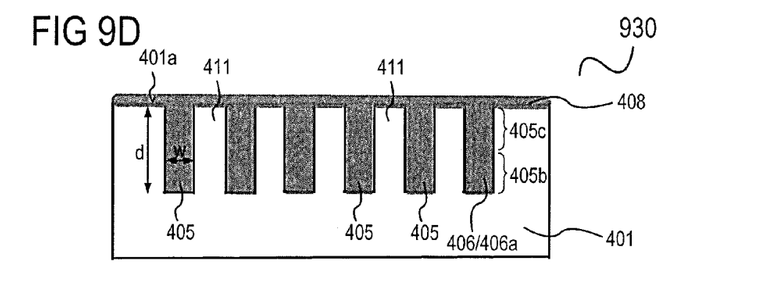

Deposition of further metal or metal alloy may lead to final filling of the nanoholes 405 and covering at least part of the side 401a of the first layer 401 with the further metal or metal alloy, as shown in FIG. 9D in a view 930. Illustratively, a third layer 408 containing or consisting of the same (or different) metal or metal alloy may be deposited over the side 401a of the first layer 401. The third layer 408 may serve to completely fill the nanoholes 405 (or at least some of the nanoholes 405) and to cover at least part of the side 401a of the first layer 401, as shown. For example, the second layer 406 and the third layer 408 may form a contiguous metal or metal alloy layer in accordance with some embodiments.

In accordance with some embodiments, it may be possible to iterate some or all of the processes described above in connection with FIGS. 9C and 9D, i.e. cleaning the surface of the deposited metal or metal alloy, heating the metal nanocrystals in the nanoholes to melt the nanocrystals, and redepositing metal or metal alloy, to obtain complete filling of the nanoholes with metal or metal alloy.

The embodiments described above in connection with FIGS. 4A to 4F, 5A to 5D, and 9A to 9D have been described in the context of depositing metal over a nanostructured semiconductor layer, i.e. the first layer 401 has been described as including or consisting of a semiconductor material, and the second layer 406 and the third layer 408 have been described as including or consisting of a metal or metal alloy. It should be noted that the physical interlocking mechanism described herein above, for example, may also apply to the more general case of a second layer including or consisting of a second material being deposited over a nanostructured first layer including or consisting of a first material, wherein the first material and/or the second material may, for example, be an insulating material, or a semiconducting material, or a conductive material, and/or wherein the first material and the second material may be the same or may be different materials. Thus, in accordance with various embodiments, the first layer 401 shown above may include or consist of other materials than semiconductors, and the second layer 406 and/or the third layer 408 shown above may include or consist of other materials than metals or metal alloys.

A method for manufacturing a layer arrangement in accordance with various embodiments may include: providing a first layer having a side; forming one or more nanoholes (e.g. nanocavities or nanopores) in the first layer that are open towards the side of the first layer; depositing a second layer over the side of the first layer after forming the nanoholes.

In accordance with an embodiment, the second layer may fill at least part of the nanoholes and cover at least part of the side of the first layer.

In accordance with another embodiment, the second layer may fill the nanoholes completely.

In accordance with another embodiment, forming the nanoholes in the first layer may include: forming a nanoporous mask layer over the side of the first layer; etching the first layer using the nanoporous mask layer as an etch mask; and removing the nanoporous mask layer after etching the first layer.

In accordance with another embodiment, forming the nanoporous mask layer over the side of the first layer may include forming a nanoporous alumina layer over the side of the first layer.

In accordance with another embodiment, forming the nanoporous alumina layer over the side of the first layer may include: depositing an aluminum layer over the side of the first layer; and anodic oxidation of the aluminum layer in an acidic electrolyte.

In accordance with another embodiment, forming the nanoporous mask layer over the side of the first layer may include forming a nanoporous polymer layer over the side of the first layer.

In accordance with another embodiment, forming the nanoporous polymer layer over the side of the first layer may include: depositing a block copolymer material over the side of the first layer; and selectively etching at least one polymer component of the block copolymer material.

In accordance with another embodiment, the second layer may be heated after depositing the second layer over the side of the first layer; and a third layer may be deposited over the side of the first layer after heating the second layer, wherein the third layer includes a metal or metal alloy.

In accordance with another embodiment, the second layer and the third layer may include or consist of the same metal or metal alloy.

In accordance with another embodiment, the second layer may be cleaned before heating the second layer.

In accordance with another embodiment, the second layer may include one or more of the following materials: a metal or metal alloy, a glass material, a polymer material, a ceramic material.

In accordance with another embodiment, the first layer may include a semiconductor material, for example silicon, and the second layer may include a metal or metal alloy.

In accordance with another embodiment, providing the first layer may include providing a semiconductor substrate, wherein the first layer is part of the semiconductor substrate.

In accordance with another embodiment, the semiconductor substrate may be a wafer, for example a silicon wafer.

In accordance with another embodiment, the side of the first layer may be a backside of the wafer and the second layer may include or may be a backside metallization, e.g. a backside metallization of a chip.

In accordance with another embodiment, the first layer may include an electrical terminal region, for example a source/drain region.

A method for manufacturing a layer arrangement in accordance with various embodiments may include: providing a semiconductor layer having a side; forming a plurality of nanoholes (e.g. nanocavities or nanopores) in the semiconductor layer that are open towards the side of the semiconductor layer; depositing a metal or metal alloy over the side of the semiconductor layer to fill at least part of the nanoholes and cover at least part of the side of the semiconductor layer.

In accordance with an embodiment, forming the plurality of nanoholes in the semiconductor layer may include or may be achieved by: forming a nanoporous mask layer over the side of the semiconductor layer; and etching the semiconductor layer using the nanoporous mask layer as an etch mask.

In accordance with another embodiment, the mask layer may include or consist of porous alumina or a porous polymer material.

In accordance with another embodiment, forming the nanoporous mask layer over the side of the semiconductor layer may include or may be achieved by: depositing an aluminum layer over the side of the semiconductor layer; and anodic oxidation of the aluminum layer in an acidic electrolyte to form a nanoporous alumina layer.

In accordance with another embodiment, forming the nanoporous mask layer over the side of the semiconductor layer may include or may be achieved by: depositing a block copolymer material over the side of the semiconductor layer; and selectively etching at least one polymer component of the block copolymer material to form a nanoporous polymer layer.

In accordance with another embodiment, the metal or metal alloy may be heated after depositing the metal or metal alloy over the side of the semiconductor layer; and further metal or metal alloy may be deposited over the semiconductor layer after heating the metal or metal alloy.

In accordance with another embodiment, the metal or metal alloy and the further metal or metal alloy may include or may be the same metal or metal alloy.

In accordance with another embodiment, providing the semiconductor layer may include providing a semiconductor substrate, for example a wafer, for example a silicon wafer, wherein the semiconductor layer is part of the semiconductor substrate, e.g. wafer, e.g. silicon wafer.

In accordance with another embodiment, the side of the semiconductor layer may be a backside of the semiconductor substrate, e.g. wafer.

A method for manufacturing a layer arrangement in accordance with various embodiments may include: forming an etch mask over a substrate, the etch mask including a nanohole array; etching the substrate using the etch mask to form nanoholes (e.g. nanocavities or nanopores) in the substrate; removing the etch mask after etching the substrate; and depositing a layer over the substrate to fill at least part of the nanoholes and cover at least part of the substrate with the layer.

In accordance with an embodiment, the layer may include or may consist of a metal or metal alloy.

In accordance with an embodiment, the etch mask may include porous alumina or a porous polymer material.

In accordance with another embodiment, the substrate may be a wafer, for example a silicon wafer.

In accordance with another embodiment, forming the etch mask over the substrate may include forming the etch mask over a backside of the wafer.

In accordance with another embodiment, the layer may include or be a backside metallization.

A layer arrangement in accordance with various embodiments may include: a first layer having a side; one or more nanoholes in the first layer that are open towards the side of the first layer; a second layer filling at least part of the nanoholes and covering at least part of the side of the first layer, the second layer including or consisting of at least one of the following materials: a metal or metal alloy, a glass material, a polymer material, a ceramic material.

In accordance with an embodiment, the second layer may completely fill the nanoholes.

In accordance with another embodiment, the first layer may be part of a wafer or chip.

In accordance with another embodiment, the side of the first layer may be a backside of the wafer or chip.

In accordance with another embodiment, the second layer may include or may be a backside metallization of the wafer or chip.

In accordance with another embodiment, the first layer may include or may be an electrical terminal region, for example a source/drain region, and the second layer may include or may be an electrical contact (e.g. source/drain metal contact) connected to the electrical terminal region.

A method for depositing metal in accordance with various embodiments may include: providing a layer having a surface; forming a plurality of nanoholes (e.g. nanocavities or nanopores) in the layer that are open towards the surface of the layer; depositing metal over the layer to fill the plurality of nanoholes and cover at least part of the surface of the layer.

A method for depositing metal in accordance with various embodiments may include: providing a semiconductor layer having a surface; forming a nanoporous mask over the semiconductor layer; etching the semiconductor layer using the nanoporous mask to form a plurality of nanoholes (e.g. nanocavities or nanopores) in the semiconductor layer that are open towards the surface of the semiconductor layer; removing the nanoporous mask from the semiconductor layer having the plurality of nanoholes; depositing metal over the semiconductor layer to fill the plurality of nanoholes and cover at least part of the surface of the semiconductor layer.

A method for depositing metal in accordance with various embodiments may include: forming a mask layer over a substrate, the mask layer having an array of nanoholes; etching the substrate using the mask layer to form nanoholes (e.g. nanocavities or nanopores) in the substrate; removing the mask layer after etching the substrate; and depositing metal over the substrate to fill the nanoholes and cover at least part of the substrate.

A layer arrangement in accordance with various embodiments may include: a layer having a surface; a plurality of nanoholes in the layer that are open towards the surface of the layer; metal filling the plurality of nanoholes and covering at least part of the surface of the layer.

In accordance with an embodiment, the layer may be part of a wafer, e.g. a semiconductor wafer such as, for example, a silicon wafer.

In accordance with another embodiment, the surface may be a backside of the wafer, and the metal may include or may be a backside metallization of the wafer.

In accordance with another embodiment, the layer may include or may be an electrical terminal region, for example a source/drain region, and the metal may include or may be an electrical contact (e.g. source/drain metal contact) connected to the electrical terminal region.

The layer arrangement, or parts thereof, may alternatively or additionally be configured in accordance with one or more embodiments described herein.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A layer arrangement, comprising:
a first layer having a side;
one or more nanoholes in the first layer that are open towards the side of the first layer;
a second layer filling the nanoholes completely and covering the side of the first layer to form a plane surface of the second layer, the second layer comprising at least one of the following materials: a metal or metal alloy, a glass material, a polymer material, a ceramic material,
wherein the first layer is an electrical terminal region and the second layer is an electrical contact connected to the electrical terminal region, and wherein a surface to volume ratio of the two layers is increased by side surfaces of the nanoholes where the first layer contacts the second layer such that an ohmic resistance between the electrical terminal region and the electrical contact is reduced.

2. The layer arrangement of claim 1,
wherein the first layer is part of a wafer or chip.

3. The layer arrangement of claim 2,
wherein the side of the first layer is a backside of the wafer or chip and the second layer comprises a backside metallization of the wafer or chip.

4. The layer arrangement of claim 1,
wherein the first layer comprises a semiconductor material and the second layer comprises a metal or metal alloy.

5. The layer arrangement of claim 4,
wherein the first layer comprises a source/drain region and the second layer comprises a source/drain metal contact connected to the source/drain region.

6. The layer arrangement of claim 1,
wherein the one or more nanoholes in the first layer have a diameter of less than or equal to about 200 nm.

7. The layer arrangement of claim 6,
wherein the one or more nanoholes in the first layer have a depth of less than or equal to about 300 µm.

8. A layer arrangement, comprising:
a semiconductor layer having a side;
a plurality of nanoholes in the semiconductor layer that are open towards the side of the semiconductor layer;
a metal or metal alloy filling the nanoholes completely and covering the side of the semiconductor layer to form a plane surface of the metal or metal alloy,
wherein the semiconductor layer is an electrical terminal region and the metal or metal alloy layer is an electrical contact connected to the electrical terminal region, and
wherein a surface to volume ratio of the two layers is increased by side surfaces of the nanoholes where the semiconductor layer contacts the metal or metal alloy layer such that an ohmic resistance between the electrical terminal region and the electrical contact is reduced.

9. The layer arrangement of claim 8,
wherein the semiconductor layer is part of a wafer or chip.

10. The layer arrangement of claim 9,
wherein the side is a backside of the wafer or chip and the metal or metal alloy comprises a backside metallization of the wafer or chip.

11. The layer arrangement of claim 8,
wherein the electrical terminal region comprises a source/drain region.

12. The layer arrangement of claim 8,
wherein the one or more nanoholes in the first layer have a diameter of less than or equal to about 200 nm and a depth of less than or equal to about 300 µm.

* * * * *